US 6,653,827 B2

(12) United States Patent
Gaither et al.

(10) Patent No.: US 6,653,827 B2
(45) Date of Patent: Nov. 25, 2003

(54) ANALOG SIGNAL TEST CIRCUIT AND METHOD

(75) Inventors: Justin L. Gaither, Austin, TX (US); Marwan M. Hassoun, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/261,464

(22) Filed: Sep. 30, 2002

(65) Prior Publication Data

US 2003/0025511 A1 Feb. 6, 2003

Related U.S. Application Data

(62) Division of application No. 09/635,948, filed on Aug. 10, 2000, now abandoned.

(51) Int. Cl.[7] .......................... G01R 31/26; G01R 31/28
(52) U.S. Cl. ..................................... 324/158.1; 324/765
(58) Field of Search ............................ 324/765, 158.1, 324/760; 714/727, 724, 30

(56) References Cited

U.S. PATENT DOCUMENTS

| | | | |
|---|---|---|---|
| 5,682,352 A | 10/1997 | Wong et al. ................. | 714/719 |
| 5,923,676 A | 7/1999 | Sunter et al. ................ | 714/733 |
| 6,331,770 B1 | 12/2001 | Sugamori ................ | 324/158.1 |

FOREIGN PATENT DOCUMENTS

EP     0 650 069 A2    4/1995

*Primary Examiner*—John E. Chapman
*Assistant Examiner*—James Kerveros
(74) *Attorney, Agent, or Firm*—Fogg Slifer & Polglaze

(57) ABSTRACT

An integrated circuit includes analog test cells to determine if an analog signal is within a predetermined voltage or current range. The test cell uses one or more analog reference signals to establish boundaries of a test range. Different embodiments of the analog test cells selectively test multiple analog signals provided in an integrated circuit. A test system can be provided to test multiple analog signals of an integrated circuit by scanning multiple analog test cells distributed throughout the integrated circuit and providing the test data for analysis. An analog circuit of an integrated circuit can be tested at different stages in manufacturing, including during a wafer stage prior to separation of individual circuit dice. Further, analog circuitry can be tested and characterized without the need for analog or digital/analog testers. In contrast, a digital only tester can be used to test analog circuitry.

3 Claims, 4 Drawing Sheets

ANALOG SIGNAL TEST CIRCUIT AND METHOD

CROSS-REFERENCE TO RELATED APPLICATIONS

This Application is a divisional of U.S. application Ser. No. 09/635,948, filed Aug. 10, 2000, now abandoned.

TECHNICAL FIELD OF THE INVENTION

The present invention relates generally to circuit testing and in particular the present invention relates to testing analog signals.

BACKGROUND OF THE INVENTION

Integrated circuits typically include digital and analog circuitry. While circuitry provided in an integrated circuit is analog in nature, the analog circuits can be combined to provide a high level of system integration inside of a single integrated circuit chip. Analog signals are either voltage or current signals that vary over a specific range. Digital signals are either voltage or current signals that can have one of two discrete values, either a logic zero or logic one.

During manufacturing, it may be desired to test internal signals of the integrated circuit. To test signals in the integrated circuit, points in the circuit can be coupled to boundary scan circuitry that couples the signals to external connections. An analog boundary module can be used to connect analog signals from an integrated circuit core to an external pin. Likewise, a digital boundary module can be used to connect digital signals from the integrated circuit core to an external pin. Some integrated circuits include both analog and digital signals that need to be tested. These circuits are referred to as mixed signal circuits. Implementing boundary scan testing can result in the need for substantial dedicated external interconnect pins to route the test signal to test equipment.

Digital test equipment is used to test the digital signals and analog test equipment is used to test the analog signals. Mixed-signal testers are available, however, current mixed signal testers typically increase test time and are more expensive than traditional digital testers. IEEE test standard 1149.4 describes a standard for a mixed-signal test bus. This test bus can be coupled to a mixed-signal tester. Mixed-signal testers create extra expense and time to test mixed signal circuits, but are necessary to verify mixed-signal integrated circuits.

Further, problems in outputting analog signals from the integrated circuit can be experienced. That is, parasitic effects can change or corrupt the analog signals. In addition, the analog test equipment can have an influence on the circuitry being tested. Some analog signals are impossible to test externally due to these effects.

For the reasons stated above, and for other reasons stated below which will become apparent to those skilled in the art upon reading and understanding the present specification, there is a need in the art for circuitry and methods to test mixed signal circuits using common digital test equipment.

SUMMARY OF THE INVENTION

The above-mentioned problems with analog test circuits and other problems are addressed by the present invention and will be understood by reading and studying the following specification.

In one embodiment, an integrated circuit analog test cell comprises an analog input point to receive an analog signal, an analog reference signal input, an enable input, and a comparator coupled to the analog input point, analog reference signal input and an enable input. The comparator determines if the analog signal is within an analog range established in response to the analog reference signal and provides a digital output signal indicating a status of the determination. The integrated circuit can comprise a digital-to-analog converter circuit to generate the analog reference signal in response to a digital test signal.

In another embodiment, an integrated circuit analog test cell comprises a comparator circuit having first and second inputs, the second input is coupled to receive at least one analog reference signal, a plurality of analog input points to receive a plurality of analog signal, and a selection circuit coupled to the plurality of analog input points to selectively couple one of the analog signals to the first input of the comparator circuit. The comparator determines if an analog signal coupled to the first input is within an analog range established in response to the analog reference signal and provides a digital output signal indicating a status of the determination. Again, the integrated circuit can comprise a digital-to-analog converter circuit to generate the analog reference signal in response to a digital test signal.

A method of testing an integrated circuit comprises initiating a test mode, providing power to first and second analog test cells in response to the test mode, and providing an enable signal and a test reference signal to the first analog test cell. The method further comprises establishing a test range in response to the test reference signal, comparing an analog signal to the test range, and providing a digital output signal having a first state if the analog signal has a value within the test range. The digital output has a second state if the analog signal has a value that is outside the test range.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
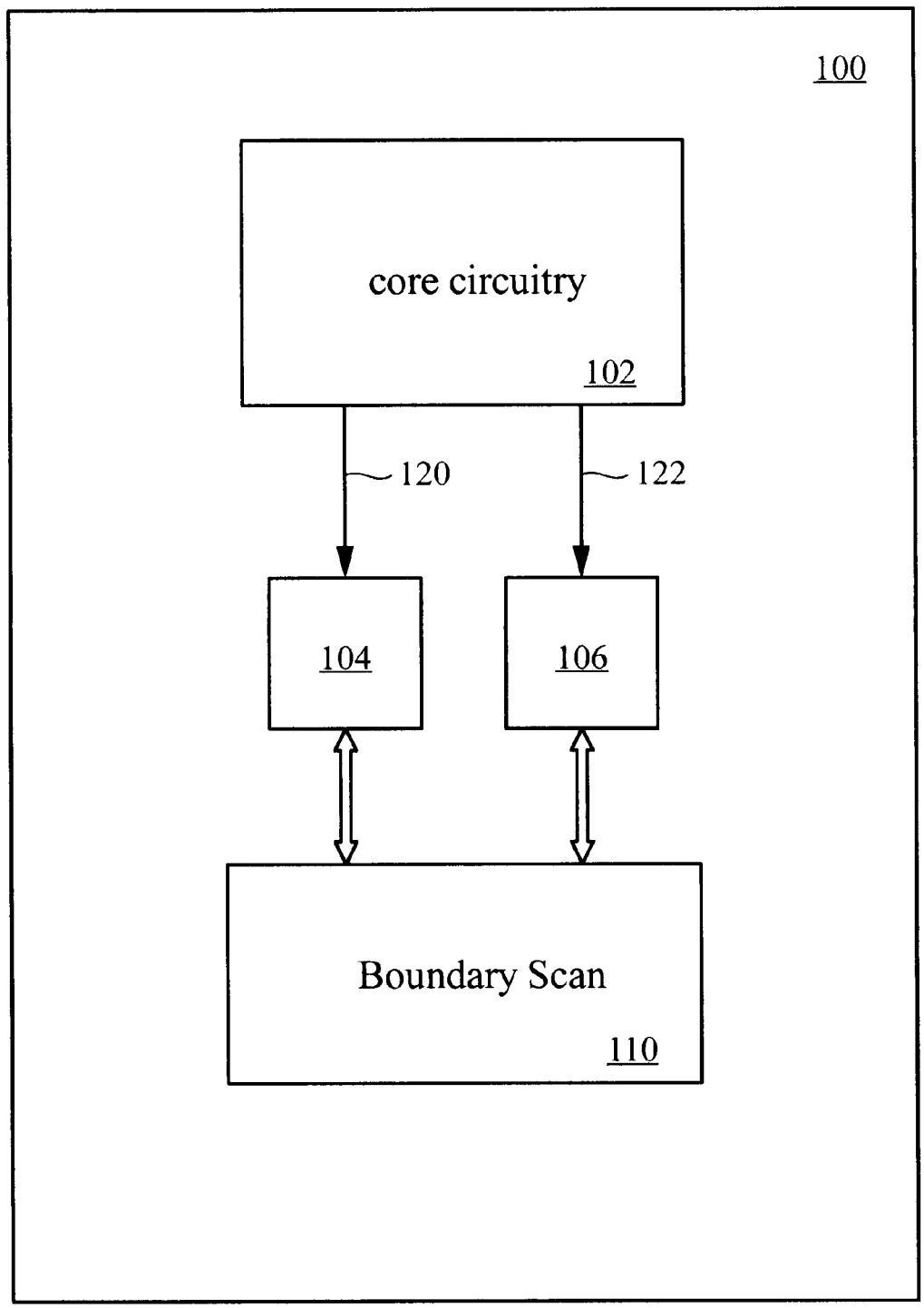
FIG. 1 is a Block diagram of an integrated circuit according to an embodiment of the present invention.

FIG. 1 illustrates a block diagram of an integrated circuit 100 according to one embodiment of the present invention.

The integrated circuit includes a circuit core 102, analog test cells 104 and 106, and boundary scan circuit 110. The circuit core includes circuitry that provides analog signals on internal points 120 and 122. The analog test cells are located in proximity to an analog point so that signal on the points can be tested with minimal parasitic effects on the analog signal. Each analog test cell 104 and 106 provides a digital output signal that indicates if an analog signal on the point is within a specified test range. That is, if the tested signal is in a specific range, a digital signal having one logic state is output. The digital output signal has an opposite logic state if the tested signal is outside the specific range. The analog signal being tested can be either an analog current or an analog voltage signal. The boundary scan circuitry 110 communicates with the analog test cells to perform tests on the core circuitry 102.

Figure 2:
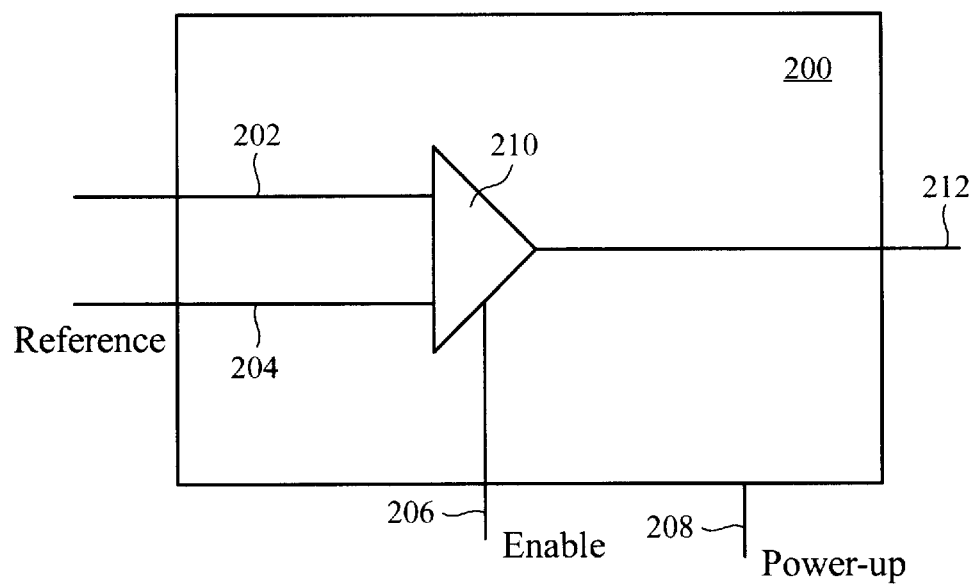
FIG. 2 is a schematic diagram of a single input analog test cell of one embodiment of the present invention.

Referring to FIG. 2, a more detailed description of one embodiment of an analog test cell and corresponding circuitry is provided. The analog test cell 200, in one embodiment, has one input point 202 that is coupled to an analog signal point of the core circuitry. The test cell can have an enable input 206 to receive an enable signal. As such, different analog test cells located throughout the integrated circuit can be selectively enabled or disabled, depending on which analog points are desired to be tested. The test cell includes an analog comparator circuit 210. The comparator circuit 210 has at least one reference signal input 204 that provides an analog reference signal to the comparator. The analog test cell 200 has a power-up point 208 that can be used to turn the test cell on during test mode operations. Thus, during non-test operations the cell can be deactivated. The enable signal is used to enable the test cell for a specific analog signal test, while the powerup signal is used to provide power to all test cells in an integrated circuit during a test operation.

In an embodiment that has one test signal input 202, several options are available for establishing a test window for the analog signal. That is, the analog test cell compares an analog signal from the circuit under test to an analog test window to determine if the tested signal is within upper and lower boundaries of the test window. In one embodiment, a lower window boundary of the test window is provided on the reference signal input 204. The analog test cell 200 then generates an upper window boundary based upon a predetermined window range. Likewise, in another embodiment an upper window boundary is provided on the reference signal input 204, and the analog test cell generates the lower window boundary based upon a predetermined window range. In a third embodiment, the reference voltage on input 204 has a level that is in the middle of the window. The analog test cell 200 then generates both the upper and the lower boundaries. In all embodiments, an analog reference signal is provided to establish a reference point for the comparator 210, as such the signal can be considered an analog reference signal. The analog test cell then determines the boundaries for the test window based on the provided reference signal.

Figure 6:
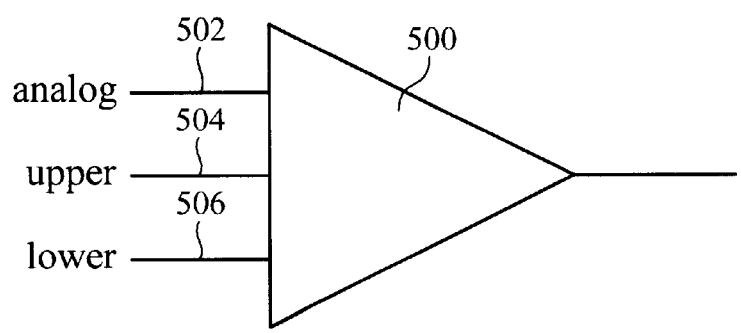
FIG. 6 illustrates a comparator having two reference signal inputs.

All of the analog test cells described herein provide a comparator circuit that compares at least one analog signal to an analog range. It will be appreciated by those skilled in the art with the benefit of the present description that a comparator with a single reference level can be used. This embodiment may not be as desirable as a compare window embodiment because process, voltage and temperature variations may shift the analog signal with respect to the single reference signal. FIG. 6 illustrates a comparator circuit 500 that can be used in any of the embodiments described herein. The comparator circuit has at least one input 502 to receive an analog signal and upper and lower reference inputs 504 and 506. As such, the test cell analog window is established with two analog reference signals provided on inputs 504 and 506.

Figure 3:
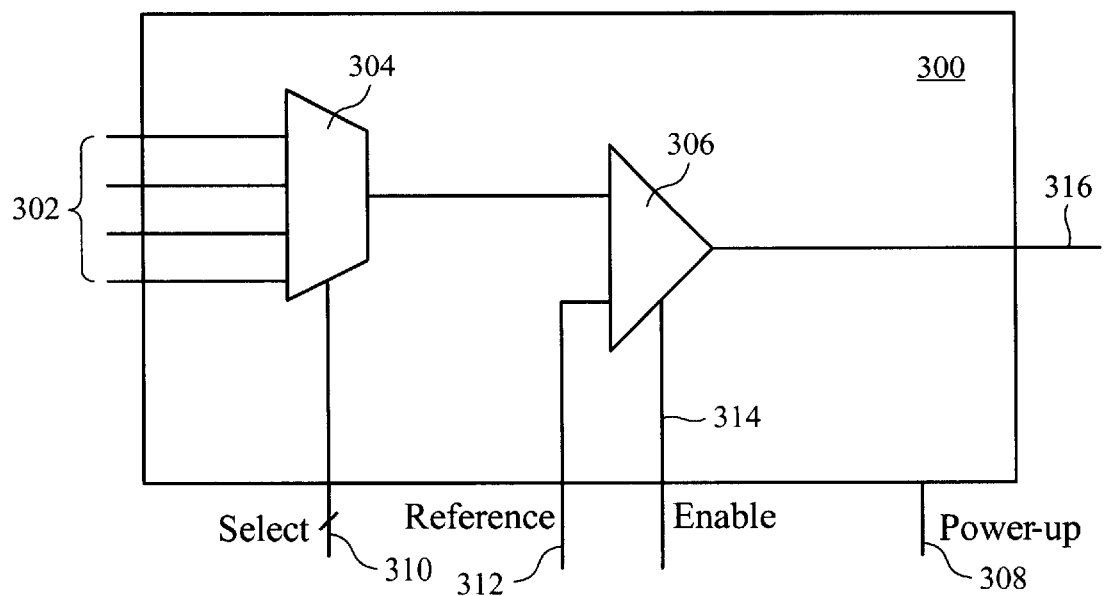
FIG. 3 is a schematic diagram of a multiple input analog test cell of another embodiment of the present invention.

The above described analog test cell has a single input point for testing one analog signal. As illustrated in FIG. 3, an analog test cell 300 can be provided that comprises multiple input points 302 to selectively test one of multiple analog signals. The analog test cell includes selection circuitry 304 to route one analog signal to a comparator circuit. The selection circuitry 304 can be a multiplex circuit, or can be separate pass circuits that are controlled by a plurality of select signals on lines 310. The selection circuitry is coupled to a comparator 306. The comparator circuit also receives at least one reference signal 312, as described above. The comparator determines upper and lower boundaries for the analog test window and provides a digital output signal on point 316. The analog test cell 300 has a power-up point 308 to provide power during a test mode operation. An optional enable signal 314 can be provided to enable comparator 306. In both embodiments 200 and 300, a comparator circuit determines if a selected analog signal is within a window defined by the reference signal(s) 204 and 312.

Figure 4:
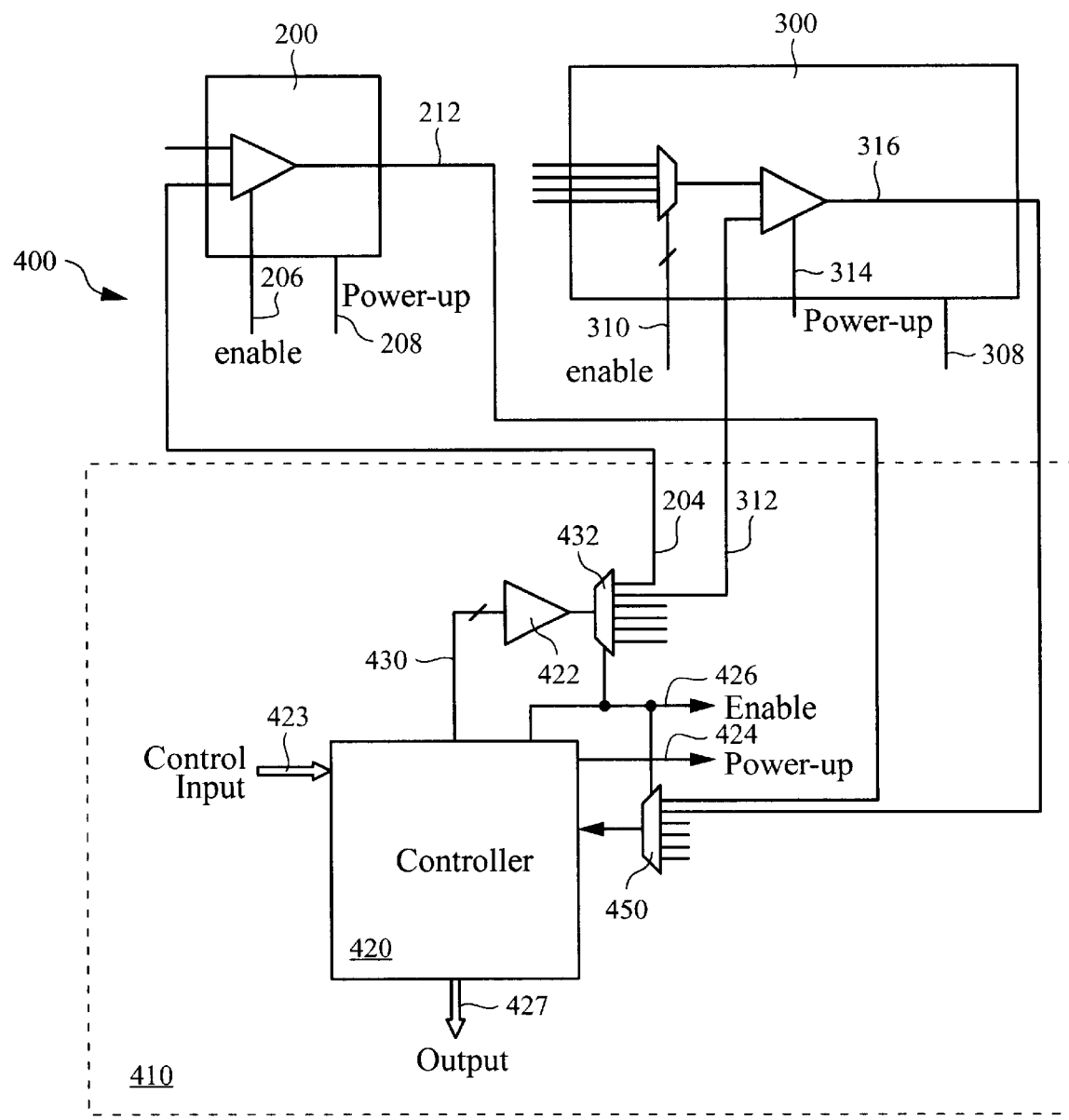
FIG. 4 is a schematic diagram of an integrated circuit having an analog test system according to an embodiment of the present invention.

Referring to FIG. 4, a more detailed diagram of an integrated circuit 400 of one embodiment of the present invention is described. The circuit includes both a single input analog test cell 200 and a multiple input analog test cell 300. Both test cells are coupled to a test control circuit 410. The test control circuit includes a controller 420 and one or more digital-to-analog converters 422. The controller provides digital signals 430 to the digital-to-analog converter 422, such as an 8-bit signal, and the digital-to-analog converter provides the reference test signal(s) to the analog test cells.

The controller can be operated according to Institute of Electrical and Electronics Engineers (IEEE) standard 1149.1, incorporated herein by reference. The present invention, however, is not limited to a specific controller. The controller receives input control signals 423 that place the controller in a test mode. The controller provides output signals on lines 427 that comprise digital test data from the analog test cells. In addition, the controller can be coupled to digital test circuitry (not shown) to provide test data from digital signal points in the core circuitry.

In operation, the controller 420 is placed in a test mode state. The controller can provide a global power-up signal 424 to the analog test cells during the test mode. In other embodiments, the analog test cells can be powered during the test mode by a separate circuit, or can remain powered during the integrated circuit operation. During operation, the controller 420 provides digital output signals 430 to the digital-to-analog converter circuit. As explained above, the analog reference signal from the digital-to-analog converter is coupled to the analog test cell of the integrated circuit. A decode circuit 432, or de-multiplex circuit, selectively couples the analog reference signal to a selected analog test cell. In combination, the controller selectively controls an enable/selection bus 426 that is coupled to the enable and selection inputs 206, 314 and/or 310 of the analog test cells. Thus, the enable signals and the analog reference signals are used to selectively operate the analog test cells distributed throughout the integrated circuit 400.

The digital output signals on points 212 and 316 from the analog test cells are coupled to a multiplex circuit 450. The multiplex circuit 450 is operated in response to the enable signals 426 such that an output from a selected analog test cell is coupled to the controller. In another embodiment, a reference signal output bus can be provided on the integrated circuit and coupled to the controller. Thus, the controller knows that the data provided on the bus corresponds to the analog test cell that is active.

Figure 5:
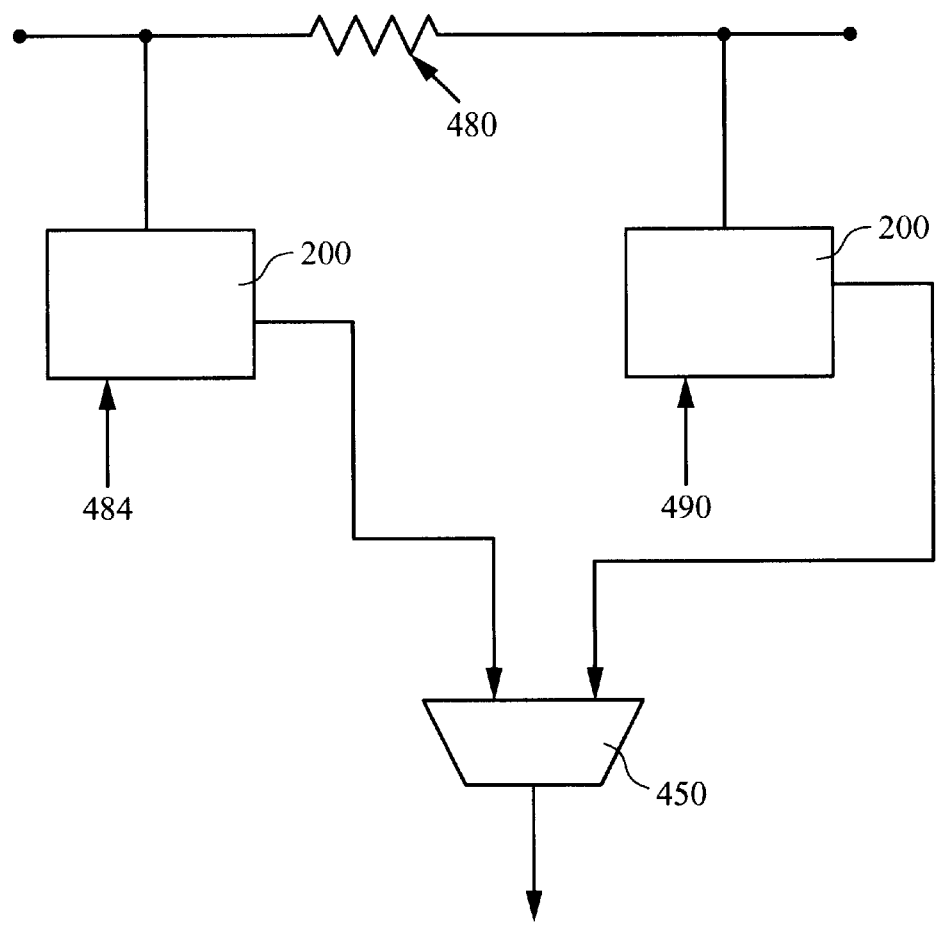
FIG. 5 illustrates two analog test cells coupled to a circuit resistor.

The above described integrated circuit controller can scan through a plurality of analog test cells to test a plurality of analog signal points. The analog test cells allow for a wide range of flexibility in design and testing of analog circuitry. For example, two analog test cells 200 can be coupled to a resistor 480 as illustrated in FIG. 5. Each test cell has a reference signal input 484 or 490. This arrangement allows for an accurate measurement of the resistor value. That is, the analog reference signals can be incremented up until the analog signal from the resistor 480 point falls outside of the test range, and then the reference signal can be decreased until the analog signal again falls outside of the range. The average value of the reference signals indicates a value of the analog point. By measuring the analog value on both sides of the resistor, the resistor value can be accurately calculated.

The present invention allows for characterization of integrated circuit die contained in a wafer during manufacturing. The invention also allows for characterization of the integrated circuit during subsequent processing stages. For example, the methods described herein can be used following packaging of the integrated circuit. As explained, the reference signal(s) can be changed during testing to provide more data during characterization. This type of test may be time consuming and limited to preproduction characterization of a circuit. During high volume manufacturing, the reference signal(s) may be held constant for a given analog signal under test.

In another embodiment, a sampling shift register can be used to sample an output of the comparator of the analog test cell using a system clock signal. Further, the test controller does not have to be included in the integrated circuit. In this embodiment, the enable and reference signals are coupled to the circuit from an external bus, and the test cell output signals are provided via a bus to the external test controller. The digital-to-analog converter circuit can be provided with the external controller, or can be provided with the integrated circuit to reduce influence on the analog reference signals.

The above described test circuitry can be used to test internal analog signals during manufacturing of an integrated circuits. As known to those skilled in the art, integrated circuits can be fabricated as part of a wafer of silicon, or similar material. The integrated circuits are formed as die arranged in the wafer. A physical separation process, such as sawing, is used to separate the individual die. The die can then be further fabricated into packaged circuits. The present invention can be used to test internal analog voltages and/or currents while the dice are still connected in the die. For example, the die can be tested during a wafer probe operation. By fully testing the integrated circuit operation early in the fabrication process, some of the costs of continued fabrication of a defective die could be avoided. The present invention improves upon traditional wafer probe tests by allowing analog circuits to be tested and characterized using different input signals, as explained above. The system can scan multiple analog test circuits distributed throughout the integrated circuit die and provide digital test data for analysis. Digital test patterns can be generated to test the analog circuits inside the integrated circuit. Thus, during pre-production testing test windows can be varied to test analog signals in greater detail.

The present invention further reduces the need for complex and often expensive analog test equipment. That is, digital test equipment can be used with the present invention to test analog circuitry without the need for an analog tester. In addition to the economic savings, reducing the need for a separate analog tester can decrease the time needed to test digital and analog points in an integrated circuit.

CONCLUSION

An integrated circuit has been described that includes analog test cells. The test cells can determine if an analog signal is within a predetermined voltage or current range. The test cell uses one or more analog reference signals to establish the boundaries of the test range. Different embodiments of the analog test cells have been described to selectively test multiple analog signals provided in an integrated circuit. A test system has also been described that can be provided to test multiple analog signals of an integrated circuit and provide digital results. The system can scan multiple analog test cells distributed throughout the integrated circuit and provide digital test data for analysis. Further, digital test patterns can be generated to test the analog circuits inside the integrated circuit. That is, during pre-production testing the test windows can be varied to test analog signals in greater detail, while in production testing the reference signal can be maintained constant for an analog signal under test.

The above described circuits and methods allow an integrated circuit to be tested using digital test equipment. That is, both analog and digital signals in an integrated circuit can be tested using the present invention with digital test equipment. The invention can be implemented with a comparator and an analog reference range. The reference range allows for testing an integrated circuit without concerns for expected variations due to temperature, voltage and process variables. The test reference range provides the flexibility of using a set pattern during production testing or changing the test reference range during characterization or de-bug operations. The reference values are provided using digital test patterns converted to analog values.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
  a test controller for providing a digital reference signal, an enable signal on an enable bus and a power-up signal on a power-up line;
  a digital-to-analog converter to convert the digital reference signal to an analog reference signal;
  a de-multiplex circuit coupled the digital-to-analog converter to selectively couple an output of the digital-to-analog converter to one of a plurality of reference signal points;
  a first analog test cell coupled to the enable bus and the power-up line, the first analog test cell comprises a first comparator to compare a first analog signal to a first analog range and provide a first digital output indicating if the first analog signal has a value within the first analog range;
  a second analog test cell coupled to the enable bus and the power-up line, the second analog test cell comprises a second comparator to compare a second analog signal selected from a plurality of analog signals to a second analog range, the second analog test cell provides a second digital output indicating if the second analog signal has a value within the second analog range; and a multiplex circuit coupled to the first and second analog test cells to selectively couple the first or second digital output signal to the test controller.

2. The integrated circuit of claim 1 wherein the test reference signal establishes a lower boundary, an upper boundary or a central value of the first or second analog range.

3. An integrated circuit comprising:

a test controller for providing a first and second digital reference signals, an enable signal on an enable bus and a power-up signal on a power-up line;

a digital-to-analog converter to convert the digital reference signal to an analog reference signal;

a de-multiplex circuit coupled the digital-to-analog converter to selectively couple an output of the digital-to-analog converter to one of a plurality of reference signal points;

a first analog test cell coupled to the enable bus and the power-up line, the first analog test cell comprises a first comparator to compare a first analog signal to a first analog range and provide a first digital output indicating if the first analog signal has a value within the first analog range;

a second analog test cell coupled to the enable bus and the power-up line, the second analog test cell comprises a second comparator to compare a second analog signal selected from a plurality of analog signals to a second analog range, the second analog test cell provides a second digital output indicating if the second analog signal has a value within the second analog range, wherein the first test reference signal establishes a lower boundary and the second test reference signal establishes an upper boundary of the first or second analog range; and a multiplex circuit coupled to the first and second analog test cells to selectively couple the first or second digital output signal to the test controller.

* * * * *